United States Patent
Franca-Neto

(12) 
(10) Patent No.: US 7,069,042 B2
(45) Date of Patent: Jun. 27, 2006

(54) QUADRATURE DIRECT SYNTHESIS DISCRETE TIME MULTI-TONE GENERATOR

(75) Inventor: Luiz Franca-Neto, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 625 days.

(21) Appl. No.: 10/286,483

(22) Filed: Nov. 1, 2002

(65) Prior Publication Data

US 2004/0087272 A1    May 6, 2004

(51) Int. Cl.
*H04B 1/38* (2006.01)
*H04M 1/00* (2006.01)

(52) U.S. Cl. .............................. 455/550.1; 455/233.1; 455/227; 455/231

(58) Field of Classification Search ............. 455/556.2, 455/550.1, 557, 74, 78, 80, 86, 18, 21, 22, 455/227, 343.3, 352, 556.1, 228, 231, 232.1, 455/233.1; 379/142.05, 199
See application file for complete search history.

(56) References Cited

U.S. PATENT DOCUMENTS

| | | | | | |
|---|---|---|---|---|---|
| 4,334,319 | A | * | 6/1982 | Gurry | 455/227 |
| 4,947,171 | A | * | 8/1990 | Pfeifer et al. | 341/143 |
| 5,488,629 | A | * | 1/1996 | Takahashi et al. | 375/150 |
| 5,742,247 | A | * | 4/1998 | Chujo | 341/144 |
| 6,060,924 | A | * | 5/2000 | Sugano | 327/202 |

* cited by examiner

*Primary Examiner*—Tilahun Gesesse
*Assistant Examiner*—John J. Lee
(74) *Attorney, Agent, or Firm*—Lanny L. Parker

(57) ABSTRACT

A tone generator in a transceiver of a communications device may generate an arbitrary signal using two shift registers to generate the time intervals. During each time interval, a different capacitor is switched onto the node to change the voltage potential on that node. The amplitude of the waveform during each time interval is changed to provide the desired tone.

17 Claims, 4 Drawing Sheets

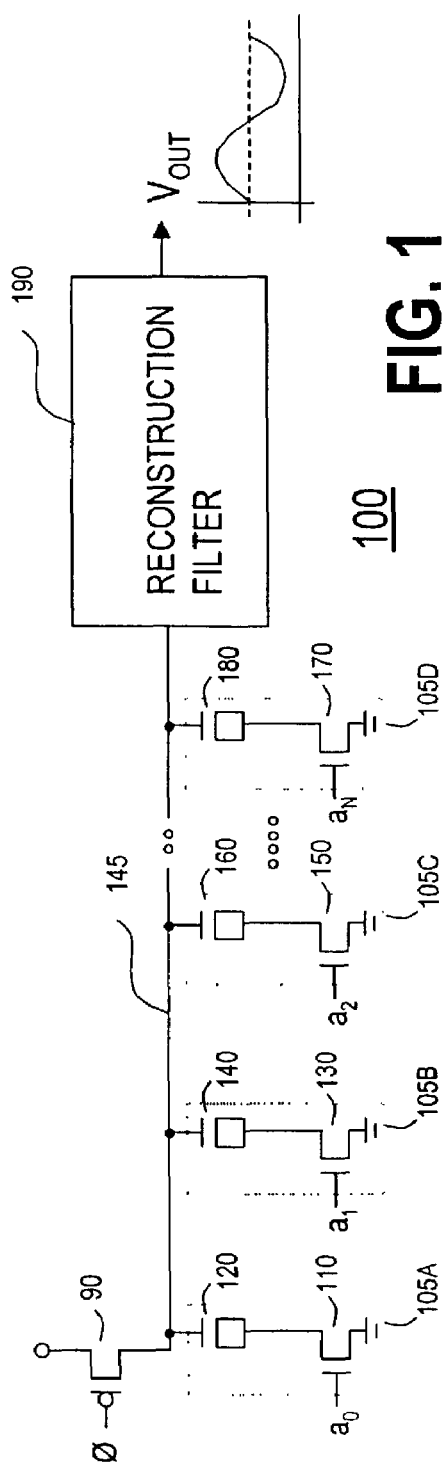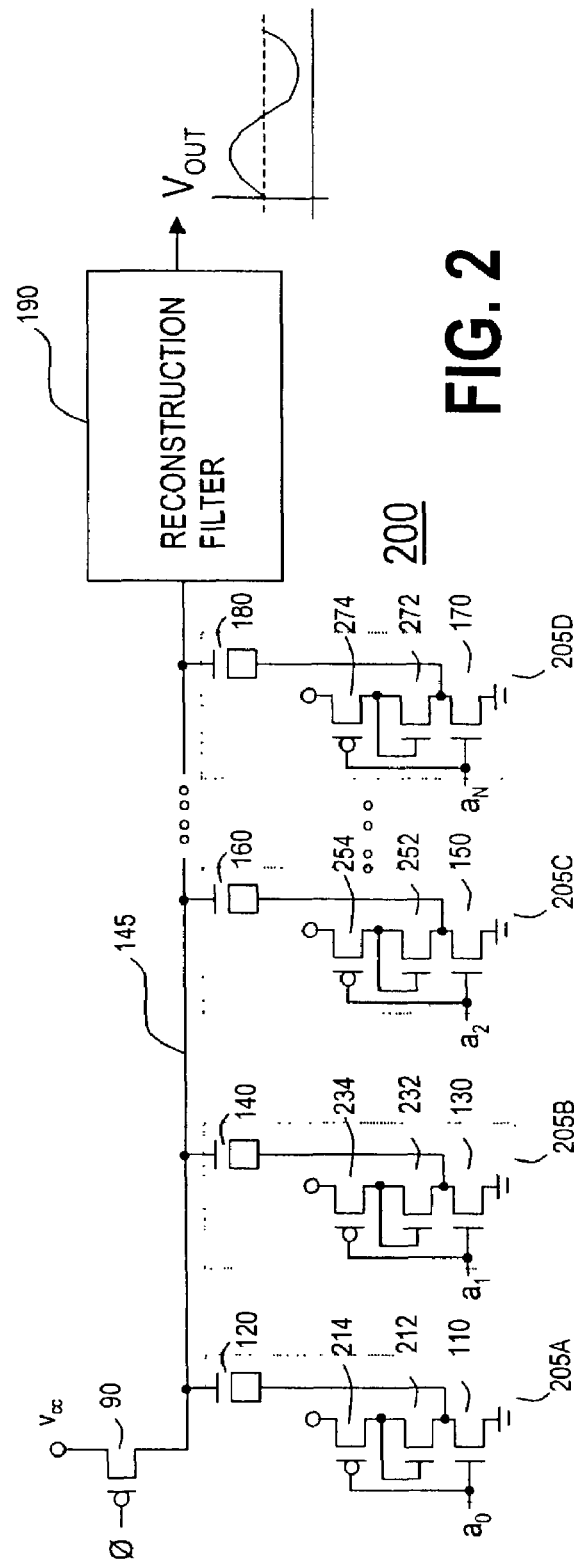

QUADRATURE DIRECT SYNTHESIS DISCRETE TIME MULTI-TONE GENERATOR

Wireless devices may operate within a coverage region or a cell and use access schemes that enable users to communicate with one another. The wireless devices typically include mixers to receive the modulated Radio Frequency (RF) signals that are down converted to a lower frequency range. To achieve the frequency conversion, the modulated RF signals are "mixed" with a Local Oscillator (LO) signal to translate the carrier frequency of the modulated signal from the RF range to the Intermediate Frequency (IF) range. The down converted signals may then be filtered and separated into an "in-phase" portion and a "quadrature" portion that are converted to digital values by Analog-to-Digital Converters (ADCs). These digital values of the baseband signals may be processed to recover the information contained in the RF signals.

In accordance with the protocol and type of communication used by the mobile communication device, multiple frequencies or tones may be used in both the modulation and demodulation processes. A need exists for a circuit and method that improves the generation of tones used in a transceiver in the modulation/demodulation process.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 is a schematic for a first embodiment of a tone generator in accordance with the present invention;

FIG. 2 is a schematic for a second embodiment of a tone generator in accordance with the present invention;

Figure 3:
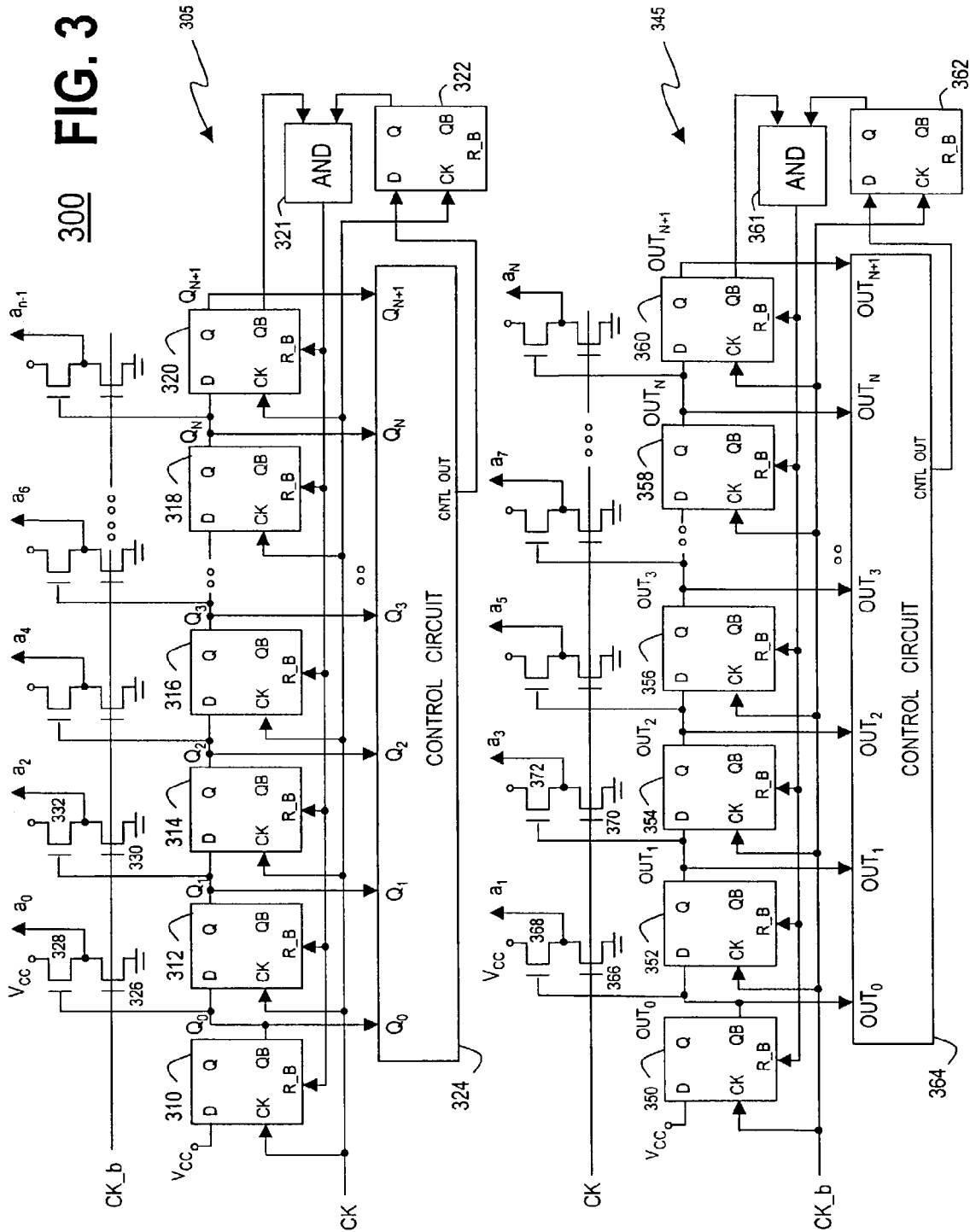
FIG. 3 illustrates a circuit for generating timing signals used for the tone generators shown in FIGS. 1 and 2.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Embodiments of the present invention may be used in a variety of applications, with the claimed subject matter incorporated into microcontrollers, general-purpose microprocessors, Digital Signal Processors (DSPs), Reduced Instruction-Set Computing (RISC), Complex Instruction-Set Computing (CISC), among other electronic components. In particular, the present invention may also be incorporated into transceivers used in smart phones, communicators and Personal Digital Assistants (PDAs), base band and application processors, automotive infotainment and other products. However, it should be understood that the scope of the present invention is not limited to these examples.

The principles of the present invention may be practiced in wireless devices that are connected in a Code Division Multiple Access (CDMA) cellular network such as IS-95, CDMA 2000, UMTS-WCDMA and distributed within an area for providing cell coverage for wireless communication. Additionally, the principles of the present invention may be practiced in a Global System for Mobile Communications (GSM) using Time Division Multiple Access (TDMA), a Wireless Local Area Network (WLAN), 802.11a–b, Orthogonal Frequency Division Multiplexing (OFDM), Ultra Wide Band (UWB), among others. The type of connection is not intended to limit the scope of the present invention.

FIG. 1 is a schematic for a first embodiment of a tone generator 100 in accordance with the present invention. Tone generator 100 includes capacitor/switch pairs 105A, 105B, 105C, . . . , and 105D each having a switch and a Metal Oxide Semiconductor (MOS) device configured to provide capacitance. In particular, capacitor/switch pair 105A includes a MOS transistor 120 with commonly connected source/drain terminals that are coupled to ground through a transistor 110. Likewise, capacitor/switch pair 105B includes a MOS transistor 140 with commonly connected source/drain terminals that are coupled to ground through a transistor 130; capacitor/switch pair 105C includes a MOS transistor 160 with commonly connected source/drain terminals that are coupled to ground through a transistor 150; and capacitor/switch pair 105D includes a MOS device 180 with commonly connected source/drain terminals that are coupled to ground through a transistor 170.

MOS transistors 120, 140, 160, . . . , and 180 each provide a capacitance whose value depends on the geometry, i.e., the width and length, of the gate material patterned for that device. The gate material of the MOS device forms the top plate of a capacitor that is separated by gate oxide from a bottom plate that is formed by the doped source/drain regions and an inversion layer of the device. By design, each MOS device may have a particular capacitance value. This capacitance is placed onto node 145 when the capacitor/switch pair is clocked at an appropriate time interval, thus changing the voltage level of that node. Although MOS transistors 120, 140, 160, . . . , and 180 have been shown as MOS transistors, the type of capacitor should not limit the scope of the present invention and other types of capacitors such as, for example, metal plates separated by a dielectric material may be used.

In addition, switches or transistors 110, 130, 150, . . . , and 170 are N-channel transistors that receive respective gate signals $a_0, a_1, a_2, \ldots, a_N$. A P-channel transistor 90 has a source connected to a power conductor to receive a voltage $V_{CC}$, a drain connected to node 145 and a gate to receive a signal Ø. A reconstruction filter 190 is connected to node 145 to provide a low pass filter that attenuates the sampling stair that occurs as switches are clocked to add/remove capacitance and to further remove any spurs that may occur at time interval edges. A signal $V_{OUT}$ is generated at the output of reconstruction filter 190.

FIG. 2 is a schematic for a second embodiment of a tone generator 200 in accordance with the present invention. In this embodiment the capacitor/switch pairs have been modified to control the bias that is applied to the source/drain region of the capacitor in the capacitor/switch pair. A diode-connected N-channel transistor 212 is included in the conduction path with transistor 110. The commonly connected gate/drain of transistor 212 is connected to the drain of a P-channel transistor 214 that has a gate to receive the signal $a_0$ and a source to receive the voltage potential $V_{CC}$. The source of transistor 212 is connected to the drain of transistor 110, with a further connection to the source/drain of transistor 120.

Capacitor/switch pair 205B includes a diode-connected N-channel transistor 232 in a conduction path with a transistor 130. The commonly connected gate/drain of transistor 232 is connected to the drain of a P-channel transistor 234 that has a gate to receive the signal $a_1$ and a source to receive the voltage potential $V_{CC}$. The source of transistor 232 is connected to the drain of transistor 130, with a further connection to the source/drain of transistor 140. Capacitor/switch pair 205C includes a diode-connected N-channel transistor 252 in a conduction path with a transistor 150. The commonly connected gate/drain of transistor 252 is connected to the drain of a P-channel transistor 254 that has a gate to receive the signal $a_2$ and a source to receive the voltage potential $V_{CC}$. The source of transistor 252 is connected to the drain of transistor 150, with a further connection to the source/drain of transistor 160. Capacitor/switch pair 205D includes a diode-connected N-channel transistor 272 in a conduction path with a transistor 170. The commonly connected gate/drain of transistor 272 is connected to the drain of a P-channel transistor 274 that has a gate to receive the signal $a_N$ and a source to receive the voltage potential $V_{CC}$. The source of transistor 272 is connected to the drain of transistor 170, with a further connection to the source/drain of transistor 180.

Diode-connected transistors 212, 232, 252 and 272 provide a voltage threshold drop that reduces the likelihood of transistors 120, 140, 160 and 180 operating in the accumulation region when their switches are "off", i.e., when signals $a_0, \ldots, a_N$ are low. And although only one diode-connected transistor has been shown in each capacitor/switch pair, it should be understood that more than one diode-connected transistor may be included by design. It also should be pointed out that FIGS. 1 and 2 show tone generators 100 and 200 providing an output signal that is illustrated as a sine wave, but it should be understood that other waveforms may be generated. In fact, arbitrary output signals may be generated based on the discrete-time samples that change the capacitances on node 145. Thus, tone generators 100 and 200 may be referred to as universal signal generators.

FIG. 3 illustrates a circuit 300 for generating timing signals that may be used with the tone generators shown in either FIG. 1 or FIG. 2. Circuit 300 includes a first shift register 305 and a second register 345. The first shift register 305 includes D-latches 310, 312, 314, 316, 318, . . . , 320 that receive the clock signal CK and generate signals $Q_0, Q_1, Q_2, Q_3, \ldots, Q_N, Q_{N+1}$ respectively. In particular, first shift register 305 includes a D-latch 310 having a QB output that provides a signal $Q_0$ that is transferred to the D input of D-latch 312; D-latch 312 has a Q output that provides a signal $Q_1$ that is transferred to the D input of D-latch 314; D-latch 314 has a Q output that provides a signal $Q_2$ that is transferred to the D input of D-latch 316; and D-latch 316 has a Q output that provides a signal $Q_3$ that is transferred to the D input of a following D-latch in the shift register. A control circuit 324 has inputs to receive the signals $Q_0, Q_1, Q_2, Q_3, \ldots, Q_N, Q_{N+1}$. Control circuit 324 generates a signal $C_NTL$ OUT that is supplied to the D input of a D-latch 322. D-latch 322 also receives the clock signal CK and generates a signal at the Q output that, along with a signal provided at the QB output of D-latch 318, are inputs of AND-gate 321. The output of AND-gate 321 is connected to the reset input (R_B) of D-latches 310, 312, 314, 316, . . . , 318 and 320.

The outputs $Q_0, Q_1, Q_2, Q_3, \ldots$, etc. are buffered to remove any overlap in the even signals $a_0, a_2, a_4, \ldots$, etc. By way of example, a buffer includes an N-channel transistor 328 having a gate connected to the QB output of D-latch 310 to receive the signal $Q_0$ and a source connected to a power conductor to receive a voltage potential of $V_{CC}$. An N-channel transistor 326 has a gate that receives the signal CK_b, a source connected to a power conductor to receive a voltage potential of $V_{SS}$ and a drain connected to the drain of transistor 328. The commonly connected drains of transistors 326 and 328 form a node from which the signal $a_0$ is supplied. Another buffer formed by transistors 330 and 332 receives the clock signal CK_b and the signal $Q_1$ from D-latch 312 and provides the signal $a_2$ to the tone generator (see FIGS. 1 and 2). Alternatively, transistors such as transistors 328 and 332 may be P-channel transistors that receive the inverted signals of those shown for $Q_0, Q_1, \ldots, Q_N$. Additional buffers are similarly shown to provide the other even signals $a_4, a_6, \ldots$, etc.

The second register 345 includes D-latches 350, 352, 354, 356, . . . , 358 and 360 that receive the clock signal CK_b and generate the signals $OUT_0, OUT_1, OUT_2, OUT_3, \ldots, OUT_N, OUT_{N+1}$, respectively. Second shift register 345 includes a D-latch 350 having a QB output that provides a signal $OUT_0$ that is transferred to the D input of D-latch 352; D-latch 352 has a Q output that provides a signal $OUT_1$ that is transferred to the D input of D-latch 354; D-latch 354 has a Q output that provides a signal $OUT_2$ that is transferred to the D input of D-latch 356; and D-latch 356 has a Q output that provides a signal $OUT_3$ that is transferred to the D input of a following D-latch in the shift register.

A control circuit 364 has inputs to receive the signals $OUT_0, OUT_1, OUT_2, OUT_3, \ldots, OUT_N, OUT_{N+1}$. Control circuit 364 generates a signal $C_NTL$ OUT that is supplied to the D input of a D-latch 362. D-latch 362 also receives the clock signal CK_b and generates a signal at the Q output that, along with a signal provided at the QB output of D-latch 358, are inputs of AND-gate 361. The output of AND-gate 361 is connected to the reset input (R_B) of D-latches 350, 352, 354, 356, . . . , 358 and 360.

The outputs $OUT_1, OUT_3, \ldots, OUT_N$, are buffered to remove any overlap in the odd signals $a_1, a_3, \ldots, a_N$. A buffer formed by transistors 366 and 368 receives the clock signal CK and the signal $OUT_0$ from D-latch 350 and provides the signal $a_1$ to the tone generator (see FIGS. 1 and 2). A buffer formed by transistors 370 and 372 receives the clock signal CK and the signal $OUT_1$ from D-latch 352 and provides the signal $a_3$ to the tone generator. Additional buffers are similarly shown to provide the other odd signals $a_5, a_7, \ldots, a_N$. Alternatively, transistors such as transistors 368 and 372 may be P-channel transistors that receive the inverted signal from $OUT_0, OUT_1, \ldots,$ and $OUT_N$.

D-latch 320 in shift register 305 and D-latch 360 in shift register 345 provide an extra clock cycle that is used to reset the shift register chains and further used to re-charge node 145 (see FIGS. 1 and 2) while signal 0 is low.

Figure 4:
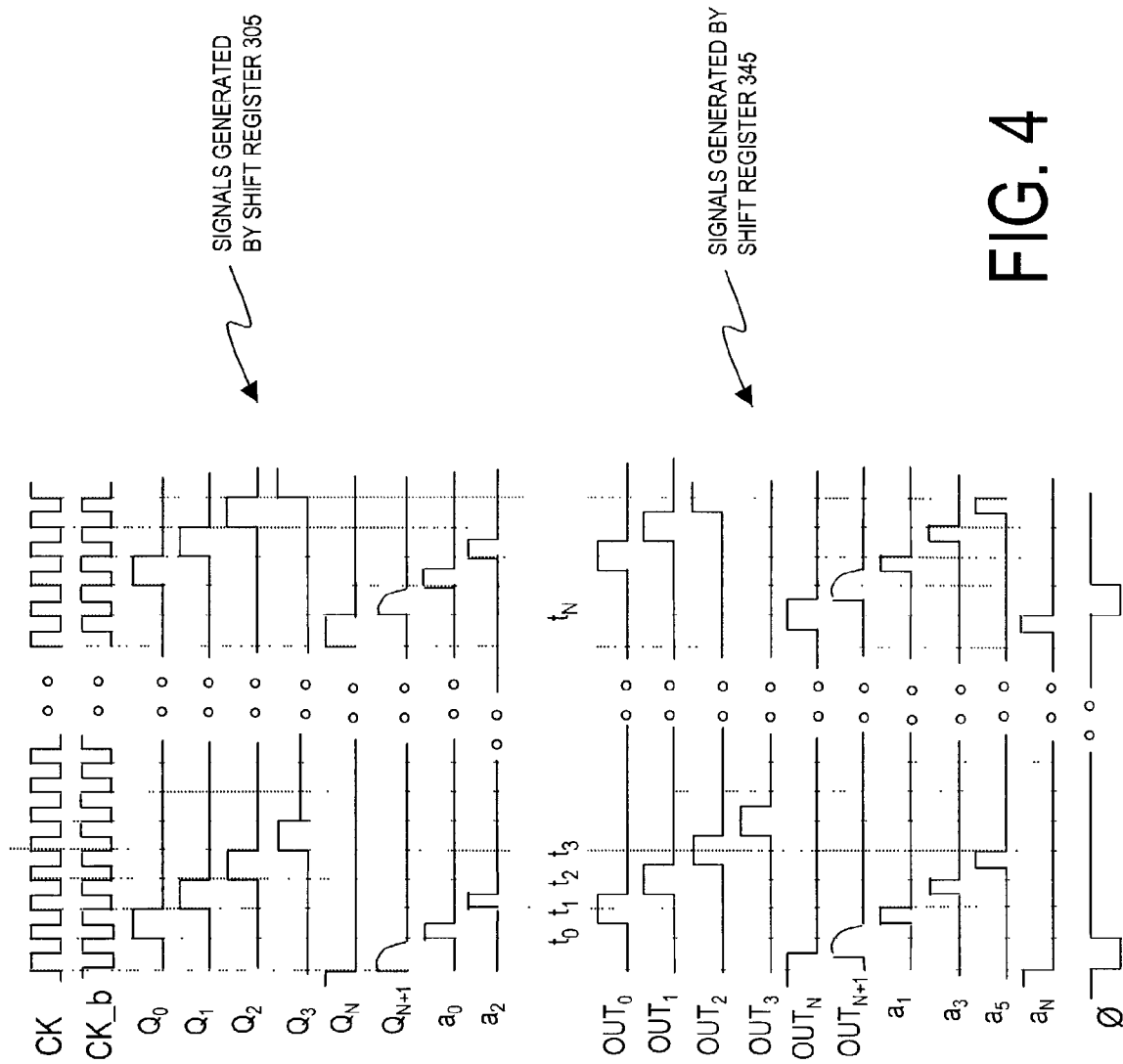
FIG. 4 is a timing diagram that illustrates the signals generated by the circuit shown in FIG. 3.

FIG. 4 is a timing diagram that illustrates the relationship between signals generated by the circuit shown in FIG. 3. Again, waveforms for the signals $Q_0, Q_1, Q_2, Q_3, \ldots, Q_N$ and $Q_{N+1}$ are generated by respective D-latches 310, 312, 314, 316, \ldots, 318 and 320. The even signals $a_0, a_2, \ldots,$ are provided from the outputs of shift register 305. Note that the signals $Q_0, Q_1, Q_2, Q_3, \ldots, Q_N$ and $Q_{N+1}$ transition based on the clock signal CK and the signal $a_0$ has a correspondence with the signal $Q_0$, the signal $a_2$ has a correspondence with the signal $Q_1$, etc.

Waveforms for the signals $OUT_0, OUT_1, OUT_2, OUT_3, \ldots, OUT_N$ and $OUT_{N+1}$ are generated by respective D-latches 350, 352, 354, 356, \ldots, 358 and 360. The odd signals $a_1, a_3, \ldots, a_N$ are provided from the outputs of shift register 345. Note that the signals $OUT_0, OUT_1, OUT_2, OUT_3, \ldots, OUT_N$ and $OUT_{N+1}$ transition based on the clock signal CK_b and the signal $a_1$ has a correspondence with the signal $OUT_0$, the signal $a_3$ has a correspondence with the signal $OUT_1$, etc.

Figure 5:
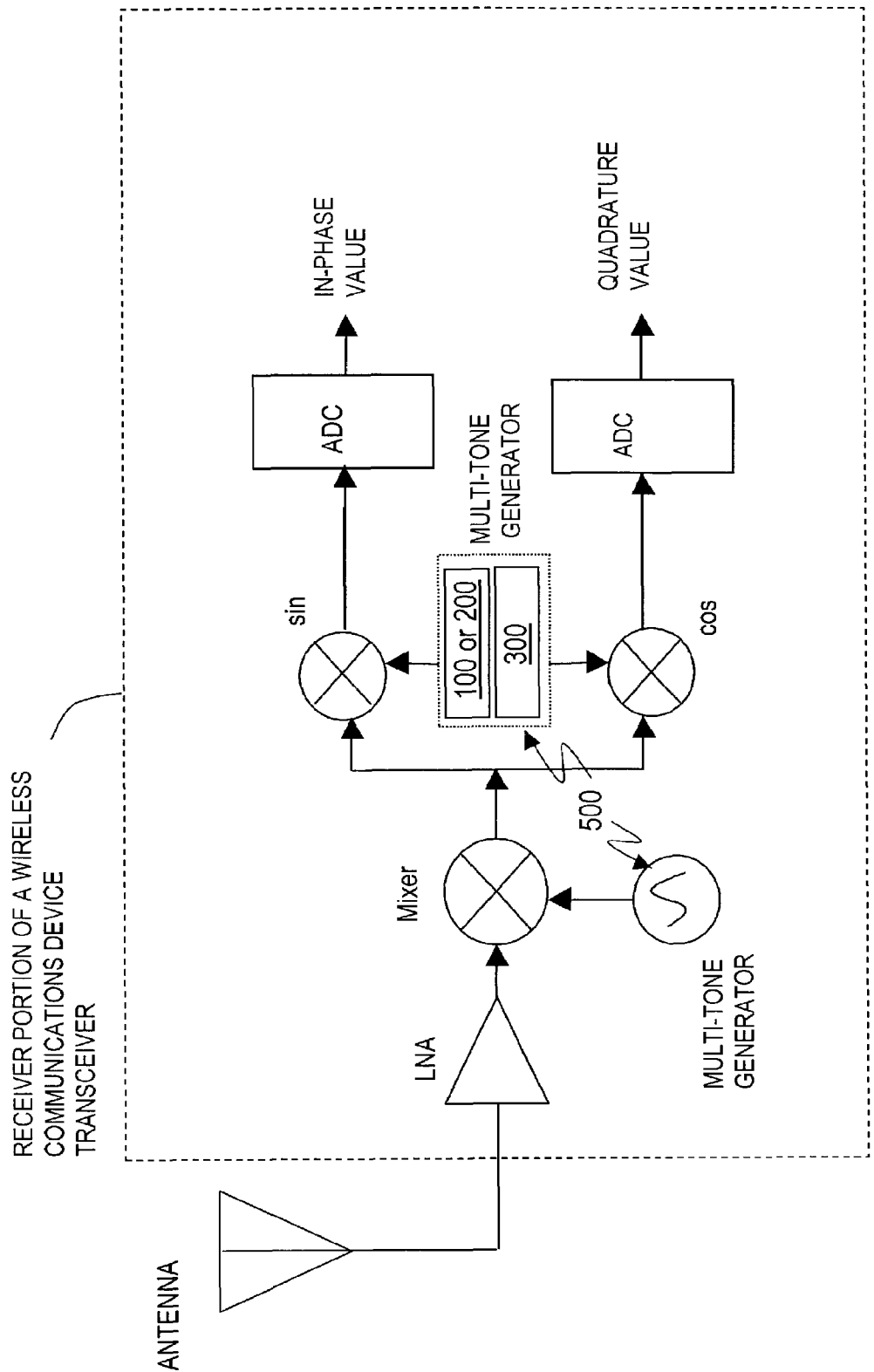
FIG. 5 shows the receiver portion of a transceiver in which the present invention may be practiced.

FIG. 5 shows the receiver portion of a transceiver in which the present invention may be practiced. The multi-tone generator system 500 may be used to provide tones used by the mixers.

In operation, circuit 300 (FIG. 3) generates timing signals $a_0, a_1, a_2, a_3, \ldots, a_N$ that may be used to switch capacitance on and off node 145 of the tone generator for the embodiments shown in either FIG. 1 or FIG. 2. Control circuits 324 and 364 inhibit multiple outputs of respective shift registers 305 and 345 from having a logic one value. Thus, both shift register 305 and shift register 345 provide output signals where only one bit has a logic one value that is right-shifted, with other bits of the shift register having logic zero values.

Referring to FIGS. 1 and 2, the signal 0 (see FIG. 4) causes transistor 90 to be conductive and initially charge node 145 to a voltage potential of about $V_{CC}$. With the signal Ø low and all of the signals $a_0, \ldots, a_N$ also low, a charge of $Q=C_P V_{CC}$ is placed on node 145, where $C_P$ is the parasitic capacitance on node 145 (excluding the capacitance from transistors 120, 140, 160, \ldots, 180). Once the signal Ø transitions high, the charge Q is trapped on node 145. As the signals $a_0, a_1, a_2, a_3, \ldots, a_N$ sequentially transition high, with one signal going high during each time interval, the voltage potential (V=Q/C) on node 145 is changed in accordance with a different capacitor being switched onto the node. Thus, capacitors $C_1, C_2, \ldots, C_N$ corresponding to transistors 120, 140, 160, and 180 are sequentially switched onto node 145 to change the amplitude of the waveform during each time interval to provide the desired tone. When the cycle of the waveform is complete following the last signal $a_N$ switching capacitor $C_N$ onto node 145, then a new cycle begins with a low transition of the signal Ø. The reconstruction filter is used to smooth the sampling stair and any spurs.

By now it should be apparent that the tone generators may generate an arbitrary signal that may be used in a transceiver circuit to modulate/demodulate signals. The tone generators may generate tones ranging from almost DC to frequencies above 12 GigaHertz (GHz), with the tones spaced apart by a couple hundred MegaHertz. Note that by using two shift registers to generate the time intervals, the tone generator may operate at twice the frequency of the clock input. It should also be pointed out that a quadrature signal may also be generated by duplicating the tone generator shown in either FIG. 1 or FIG. 2. The phase errors between the in-phase signal and the quadrature signal may be reduced by controlling the mismatch in the characteristics of the transistors and by providing layout symmetry.

One skilled in the art will recognize that the signal Ø may be synthesized using combinational logic with the clock signals CK and CK_b and the signals $a_0, \ldots, a_N$. Although embodiments have been described using non-overlapping signals $a_0, \ldots, a_N$, this feature is not intended as a limitation on the scope of the claimed subject matter. In fact, these signals may be designed to overlap at particular moments to produce additional capacitance on node 145. While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A communication device comprising:
    first and second shift registers, where the first shift register is clocked by a first clock signal and the second shift register is clocked by a second clock signal, wherein output signals from the first shift register gate the tone generator in even time intervals and output signals from the second shift register gate the tone generator in odd time intervals; and
    a tone generator coupled to receive signals from the first and second shift registers that are used to switch capacitance onto a node from which a tone signal is supplied.

2. The communication device of claim 1 wherein charge on the node is changed by alternating the even time intervals with the odd time intervals to select the capacitance.

3. The communication device of claim 1 wherein the signals from the second shift register include one signal having a logic one value and other signals have a logic zero value.

4. The communication device of claim 1 wherein the second clock signal is inverted from the first clock signal.

5. A communication device having a transceiver and comprising:
    first and second shift registers, where the first shift register is clocked by a first clock signal and the second shift register is clocked by a second clock signal;
    a tone generator coupled to receive signals from the first and second shift registers at input terminals of respective first and second switch-capacitor pairs having output terminals that selectively switch capacitance onto a node from which a tone signal is generated; and
    a mixer coupled to receive a modulated signal and the tone signal and convert a carrier frequency of the modulated signal.

6. The communication device of claim 5, wherein the switch-capacitor pairs further include:
    a transistor having a first conduction terminal coupled to a power conductor to receive a voltage potential, a gate coupled to receive a signal from one of the first and second shift registers and a second conduction terminal coupled to the node.

7. The communication device of claim 6, wherein the tone generator further includes:
a filter coupled to the node and having an output to provide a tone.

8. A wireless communication device, comprising:
a mixer coupled to receive a modulated signal and a tone;
a first shift register to receive a clock signal;
a second shift register to receive an inverted clock signal; and
a tone generator to use signals from the first and second shift registers to sequentially couple one terminal of first and second capacitors to a ground potential, the other terminal of the first and second capacitors being connected to a node to supply the tone.

9. The wireless communication device of claim 8, wherein the tone generator further comprises:
a first transistor having a gate coupled to receive a signal from the first shift register, a source coupled to the ground potential and a drain coupled to the one terminal of the first capacitor; and
a second transistor having a gate coupled to receive a signal from the second shift register, a source coupled to the ground potential and a drain coupled to the one terminal of the second capacitor.

10. The wireless communication device of claim 8, wherein the tone generator further comprises:
a filter having an input coupled to the node and an output coupled to the mixer to supply the tone.

11. The wireless communication device of claim 8, wherein the first shift register shifts a one through a field of zeros.

12. The wireless communication device of claim 8, wherein the second shift register shifts a one through a field of zeros.

13. A method, comprising:
receiving a modulated signal and a tone at a mixer;
clocking a first shift register with a clock signal;
clocking a second shift register with an inverted clock signal; and
using signals from the first and second shift registers to change a potential on first terminals of first and second capacitors, the second terminals of the first and second capacitors being connected to a node to supply the tone.

14. The method of claim 13, further including:
filtering the signal generated at the node to supply the tone to the mixer.

15. The method of claim 13, further including:
shifting a one through a field of zeros in the first shift register.

16. The method of claim 16, further including:
shifting a one through a field of zeros in the second shift register.

17. The method of claim 16, further including:
using the mixer to up-convert or down-convert a carrier frequency of the modulated signal.

* * * * *